United States Patent [19]
Ohno

[11] Patent Number: 6,104,664
[45] Date of Patent: Aug. 15, 2000

[54] MEMORY ADDRESS GENERATOR CIRCUIT AND SEMICONDUCTOR MEMORY DEVICE

[75] Inventor: Kazuki Ohno, Tokyo, Japan

[73] Assignee: NEC Corporation, Tokyo, Japan

[21] Appl. No.: 09/268,943

[22] Filed: Mar. 16, 1999

[30] Foreign Application Priority Data

Mar. 17, 1998 [JP] Japan ................................. 10-067119

[51] Int. Cl.[7] ...................................................... G11C 8/00
[52] U.S. Cl. ..................... 365/230.06; 365/236; 326/105
[58] Field of Search ......................... 365/230.03, 230.06, 365/230.08, 236; 326/105, 106, 108

[56] References Cited

U.S. PATENT DOCUMENTS

| | | | |
|---|---|---|---|
| 5,650,968 | 7/1997 | Dosaka et al. ..................... | 365/189.01 |
| 5,652,723 | 7/1997 | Dosaka et al. ..................... | 365/189.01 |
| 5,703,828 | 12/1997 | Park et al. ......................... | 365/230.03 |
| 5,805,928 | 9/1998 | Lee .................................... | 395/855 |
| 5,978,303 | 11/1999 | Takasugi et al. .................. | 365/230.03 |

FOREIGN PATENT DOCUMENTS 8-339686   12/1996   Japan .

*Primary Examiner*—Son Mai
*Attorney, Agent, or Firm*—Darryl G. Walker

[57] ABSTRACT

A semiconductor storage device (1100) having a burst mode capability for accomplishing a rapid read/write operation is disclosed. Included is a memory address generator circuit (100) having an address counter (102) which latches and increments the n least significant bits of a start address containing m bits, the address counter (102) producing a count value. An address latch (104) latches the m-n most significant bits of the start address, and an end address arithmetic circuit (106) produces a burst end address by subtracting 1 from the start address n least significant bits. A comparator circuit (108) generates a burst end signal (BSTEND) based on the comparison of the count value and the burst end address, the comparison being done by way of a generation of coincidence signals (k0–k2) by coincidence detector circuits included in the comparator circuit (108). Read/write addresses are produced for the semiconductor storage device where the m–n bits in the address latch (104) form the more significant bits of the read/write address and the count value form the less significant bits of the read/write address. The read/write operation for the memory is completed by stopping the increment operation of the address counter (102) when the burst end signal is generated.

20 Claims, 13 Drawing Sheets

MEMORY ADDRESS GENERATOR CIRCUIT AND SEMICONDUCTOR MEMORY DEVICE

TECHNICAL FIELD

The present invention relates generally to address generator circuits, and more particularly to a memory address generator circuit incorporated into a semiconductor storage device having a burst mode of operation.

BACKGROUND OF THE INVENTION

In an active cycle of a synchronous Dynamic Random Access Memory (DRAM) a word line is selected by a row address and a bit line is selected by a column address which is generated by an address counter. Data can be written to or read from the memory cell that is positioned at a cross point of the selected word line and bit line. In a synchronous DRAM the column address is generated through an address counter because in many cases the input and output of data is continuously conducted in a burst fashion. Only a start address for reading and writing is given externally and a subsequent address is generated by the address counter. The continuous read operation is known as a "burst read", and the continuous write operation is known as a "burst write." The number of data continuously read or written is known as a "burst length."

The burst length can be set in a programmable fashion with typical lengths being 2, 4, or 8 bit lengths. For example, in the case where the burst length is four and the start address is 3, the address counter outputs the addresses to the column decoder in the order of 3, 0, 1, and 2. In the case of a burst length of four, the specification of the synchronous DRAM designates the two lowest significant bits of the address to be incremented through the counter while the more significant address bits are not changed.

Referring to FIG. 12, a memory address generator circuit for conducting reading and writing operations as described above is set forth. The memory address generator circuit is designated by the general reference character 1200 and includes an address counter 1204 that generates a column address and a burst counter 1206 that counts the burst length. The memory address generator circuit 1200 further includes an address latch 1202 that latches an externally applied address.

In the memory address generator circuit 1200, an externally applied address is latched by the address latch 1202 and applied to the address counter 1204 as a start address. After the start address has been set, the address counter 1204 increments the address by one upon receiving subsequent clock (CLK) signals. The address counter 1204 applies its output to a column decoder (not shown) which generates a column select signal.

The burst counter 1206 is reset every time a read or write command is input thereto and increments by one every clock cycle. Given a burst length of $2^n$ (n=1, 2, 3), the burst counter 1206 generates a burst end (BSTEND) signal when all the n least significant bits of the burst counter 1206 are ones. The BSTEND signal is generated to signal the end of the burst read or burst write operation.

The memory address generator circuit 1200 shown in FIG. 12 is relatively large because it requires both an address counter 1204 and a burst counter 1206. However, a semiconductor memory device having a memory address generator circuit with only one counter as the address generator is disclosed in Japanese Unexamined Publication No. Hei 8-339686.

Referring to FIG. 13, a block schematic diagram of a semiconductor memory device, according to the above publication, is set forth. The semiconductor memory device is designated by the general reference character 1300 and includes memory blocks 1302a and 1302b. Each memory block 1302a and 1302b contains a plurality of memory cells (one of which is shown as 1304) in which data is stored. The semiconductor memory device 1300 further includes a row decoder 1306, which receives and decodes row address information and activates a main word line (MWL1 and MWL2). A sub-decoder (one of which is shown as 1308) receives the main word line and a memory block select signal and activates a sub-word line (SWL1–SWL4) in a selected memory block 1302a and 1302b.

Further included in the semiconductor memory device 1300 is a flag register 1310. The flag register 1310 stores a continuous read flag indicative of the maximum number of data to be continuously read. Further included is a cycle counter 1312, which refers to the value of the flag register 1310 and increments (or decrements) in synchronism with a clock (CLK).

An access control circuit 1314 controls the row decoder 1306 and a pre-charge circuit 1316. The pre-charge circuit 1316 charges the bit lines (BL1–BL4) to a predetermined pre-charge voltage level. An output control circuit 1318 decodes column address information and controls a column selector circuit 1320 and sub-decoders 1308. A column selector circuit 1320 selects the bit line (BL1–BL4) to be accessed during the active cycle. The column selector circuit 1320 is coupled to an output circuit 1322, which outputs the read data externally from the semiconductor memory device 1300.

Referring to FIG. 13, a description will be given of the burst operation of the semiconductor memory device 1300. In the example, it is assumed that the start address information, in response to an access command, activates the main word line MWL1. Furthermore, the start address information corresponds to an initial column address 0. In an initial memory access cycle the cycle counter 1312 is cleared or set to zero. Also, in the initial memory access cycle, the number of data bits to be continuously read is two and the flag register 1310 is set accordingly. In response to the start address information and the cycle counter value, the row decoder 1306 selects the main word line MWL1 and the output control circuit 1318 activates a memory block select signal that corresponds with memory block 1302a. As a result, sub-word line SWL1 is activated and data in the memory cell 1304 of the memory block 1302a is read and then outputted from the bit lines (BL1 and BL2) through the column selector circuit 1320 and the output circuit 1322.

In a succeeding memory access cycle, the value of the cycle counter 1312 is incremented thus becoming a value of one. Thus, the output control circuit 1318 causes the sub-word line SWL2 in memory block 1302b to be activated. As a result, data in a memory cell 1304 of the memory block 1302b is read and then outputted from the bit lines (BL3 and BL4) through the column selector circuit 1320 and the output circuit 1322.

The value of the flag register 1310 is held during the continuous memory reading operation and the flag register 1310 is not cleared until the value of the cycle counter 1312 reaches the number of data to be read minus one.

In the approach set forth in FIG. 13, the column address in the semiconductor memory device 1300 is determined according to the applied external start address and the value in the cycle counter 1312. The cycle counter value is incremented (or decremented) from zero so that the operation of the cycle counter 1312 is allowed to stop in accordance with the burst length. Data can be read for each of the burst lengths by giving only the external start address. However, in order to generate the column address, the addition of the start address and the cycle counter value must be made.

Generally, an adder circuit consumes a lot of chip space. Also, an adder circuit is typically slow in operational speed because of the carry requirement, and is particularly slow when a large number of digits are added. The semiconductor memory device 1300 set forth in FIG. 13 suffers from the drawbacks that the address generation circuitry becomes relatively large and is slow in operation, which reduces the operation speed of the memory. Additionally, the adder circuit causes an increase in the semiconductor memory device's power consumption.

In light of the aforementioned problems with the prior art approach of memory address generation, it would be desirable to provide a memory address generator circuit to be used in a semiconductor memory device for conducting reading and writing operation in a burst fashion, with improved operational speed. At the same time the memory address generator should not consume a lot of chip space or greatly increase the chip's power consumption.

SUMMARY OF THE INVENTION

According to the disclosed embodiments, a memory address generator circuit generates addresses to be used in a burst mode of operation. The address generator circuit includes a counter, which latches n lower significant bits from a m-bit start address. The counter increments the latched bits in response to a clock. An address latch is included for latching the higher m-n bits of the start address. Also included is an end address arithmetic circuit for calculating a burst end address by subtracting one from the n lower significant bits of the start address. Further included is a comparator for comparing the output of the counter with the burst end address to generate a burst end signal when the comparison indicates a match.

According to one aspect of the embodiments, the counter latch latches n lower significant bits of the address and an address latch latches the m-n higher significant bits and a read/write address is generated therefrom.

According to another aspect of the embodiments, the read/write operation of a semiconductor memory is stopped by stopping the counting of the counter when the burst end signal is generated.

According to another aspect of the embodiments, the counter includes a first counter circuit which latches the least significant bit of the start address in response to an address latch signal and increments the least significant bit upon receiving a succeeding latch signal when a first burst length designation signal is at a predetermined level.

According to another aspect of the embodiments, the counter includes a second counter circuit which latches the second least significant bit of the start address in response to an address latch signal and increments the second least significant bit upon receiving a succeeding latch signal when a first carry signal is at a predetermined level.

According to another aspect of the embodiments, the second counter circuit increments the second least significant bit upon receiving a succeeding latch signal when a second or third burst length designation signal is at a predetermined level.

According to another aspect of the embodiments, the counter includes a third counter circuit which latches the third least significant bit of the start address in response to an address latch signal and increments the third least significant bit upon receiving a succeeding latch signal when a second carry signal is at a predetermined level.

According to another aspect of the embodiments, the third counter circuit increments the third least significant bit upon receiving a succeeding latch signal when a third burst length designation signal is at a predetermined level.

According to another aspect of the embodiments, the memory address generator circuit includes an address latch, the address latch further including m-n latch circuits which latch the values of the respective m-n most significant start address bits in response to the address latch signal.

According to another aspect of the embodiments, the memory address generator includes an end address arithmetic circuit. The end address arithmetic circuit includes a first subtractor circuit that latches the least significant bit of the start address and inverts the latched value to output a first burst end bit.

According to another aspect of the embodiments, the end address arithmetic circuit includes a second subtractor circuit that latches the second least significant bit of the start address and inverts the second least significant bit when a borrow bit from the first subtractor circuit is at a predetermined level.

According to another aspect of the embodiments, the second subtractor circuit provides a second burst end bit when the second or third burst length designation signals is at a predetermined level.

According to another aspect of the embodiments, the end address arithmetic circuit includes a third subtractor circuit that latches the third least significant bit of the start address and inverts the third least significant bit when a borrow in the first subtractor circuit is at a predetermined level and a borrow in the second subtractor circuit is at a predetermined level.

According to another aspect of the embodiments, the third subtractor circuit provides a third burst end bit when the third burst length designation signal is at a predetermined level.

According to another aspect of the embodiment, the memory address generator circuit includes a comparator circuit, the comparator circuit includes a first coincidence detector circuit which detects a coincidence of the first carry signal and the first burst end address signal to output a first coincidence signal.

According to another aspect of the embodiment, the comparator circuit includes a second coincidence detector circuit which detects a coincidence between the second carry signal and the second burst end address signal to output a second coincidence signal.

According to another aspect of the invention, the second concidence detector circuit generates the second coincidence signal when either the second burst length designation signal is at a predetermined level or the third burst length designation signal is at a predetermined level.

According to another aspect of the embodiment, the comparator circuit includes a third coincidence detector circuit which detects a coincidence between the third carry signal and the third burst end address signal to output a third coincidence signal.

According to another aspect of the embodiment, the third coincidence detector circuit generates the third coincidence signal when the third burst length designation signal is at a predetermined level.

According to another aspect of the embodiment, the comparator circuit includes a compare output circuit that receives the first, second and third coincidence signals and outputs the burst end indication signal therefrom.

According to another aspect of the embodiment, in a semiconductor memory device a word line is selected by a row decoder according to a row address and a bit line is selected by a column decoder according to a column address. The data of a memory element selected according to the selected word line and selected bit line is inputted or outputted through a sense amplifier. The memory address generator circuit generates the column address, which is applied to the column decoder. Further, a burst length is designated by burst length designation signals which limit the column address generated by the memory address generator circuit.

DETAILED DESCRIPTION OF THE EMBODIMENTS

Various detailed embodiments of the present invention will now be described in conjunction with a number of block diagrams and timing diagrams. A description will be given in detail with reference to the embodiments.

Figure 1:
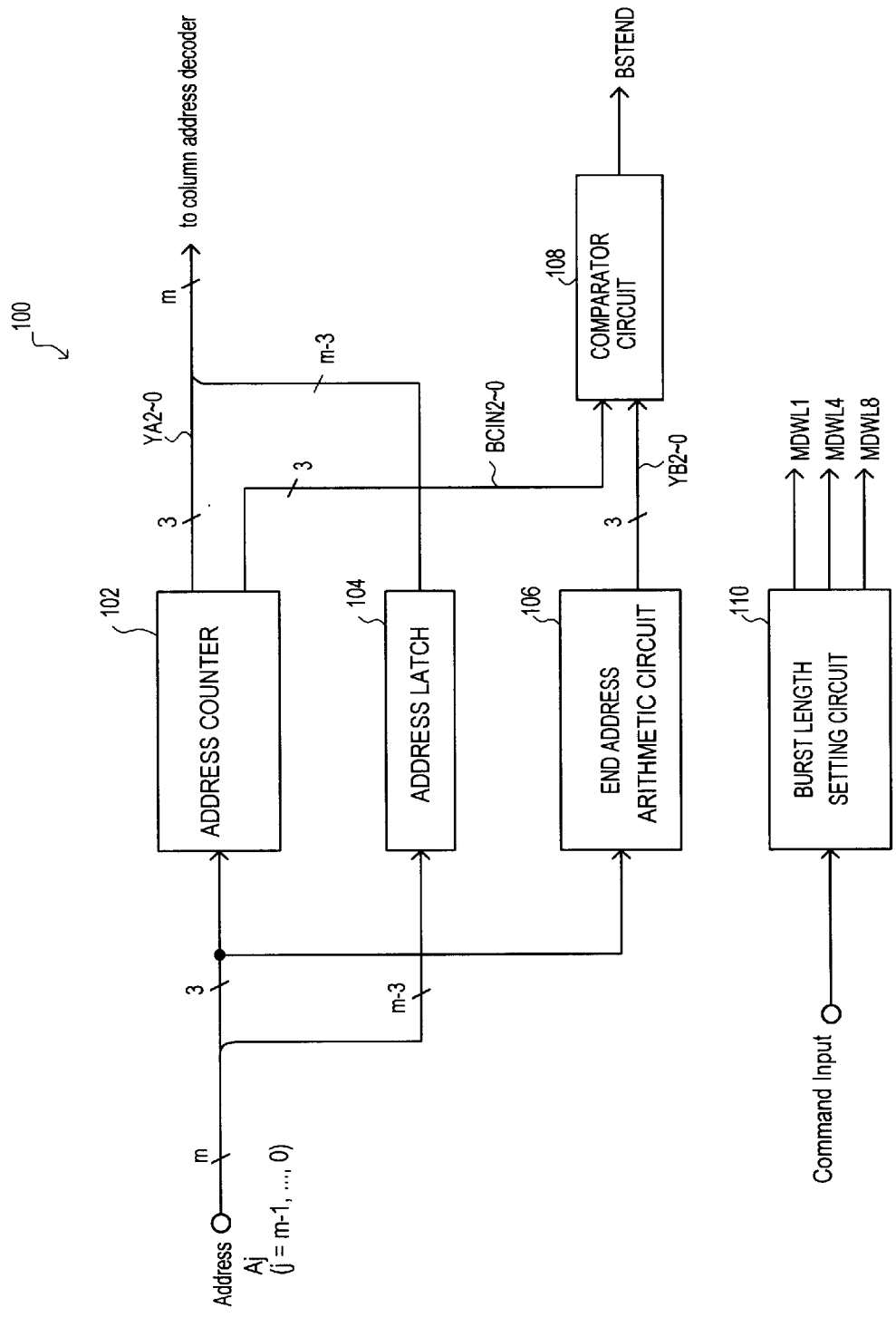
FIG. 1 is a block diagram of a memory address generator circuit according to a first embodiment of the present invention.
Figure 2:
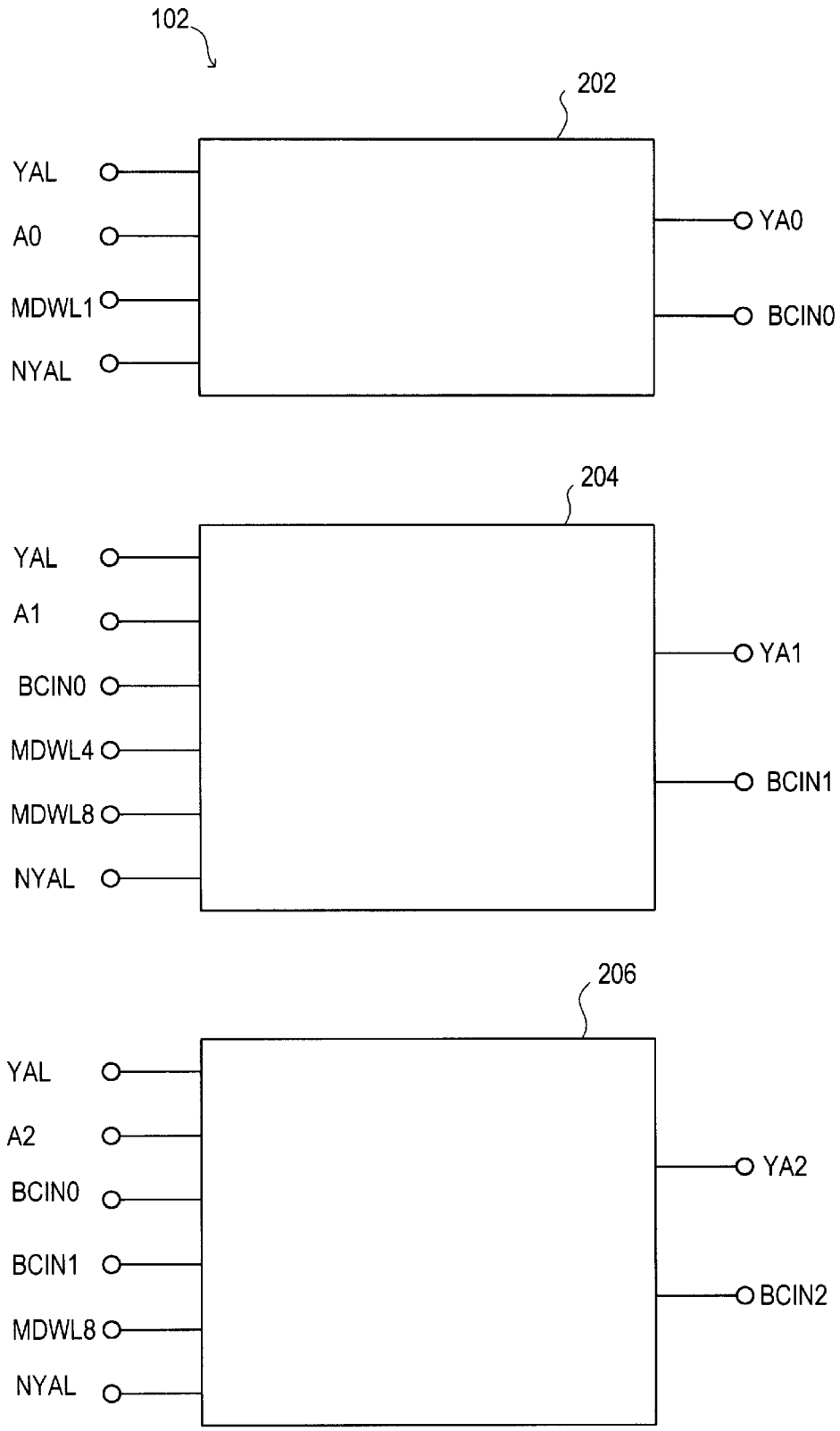
FIG. 2 is a block diagram of an address counter circuit that may be used in the first embodiment of FIG. 1.
Figure 3:
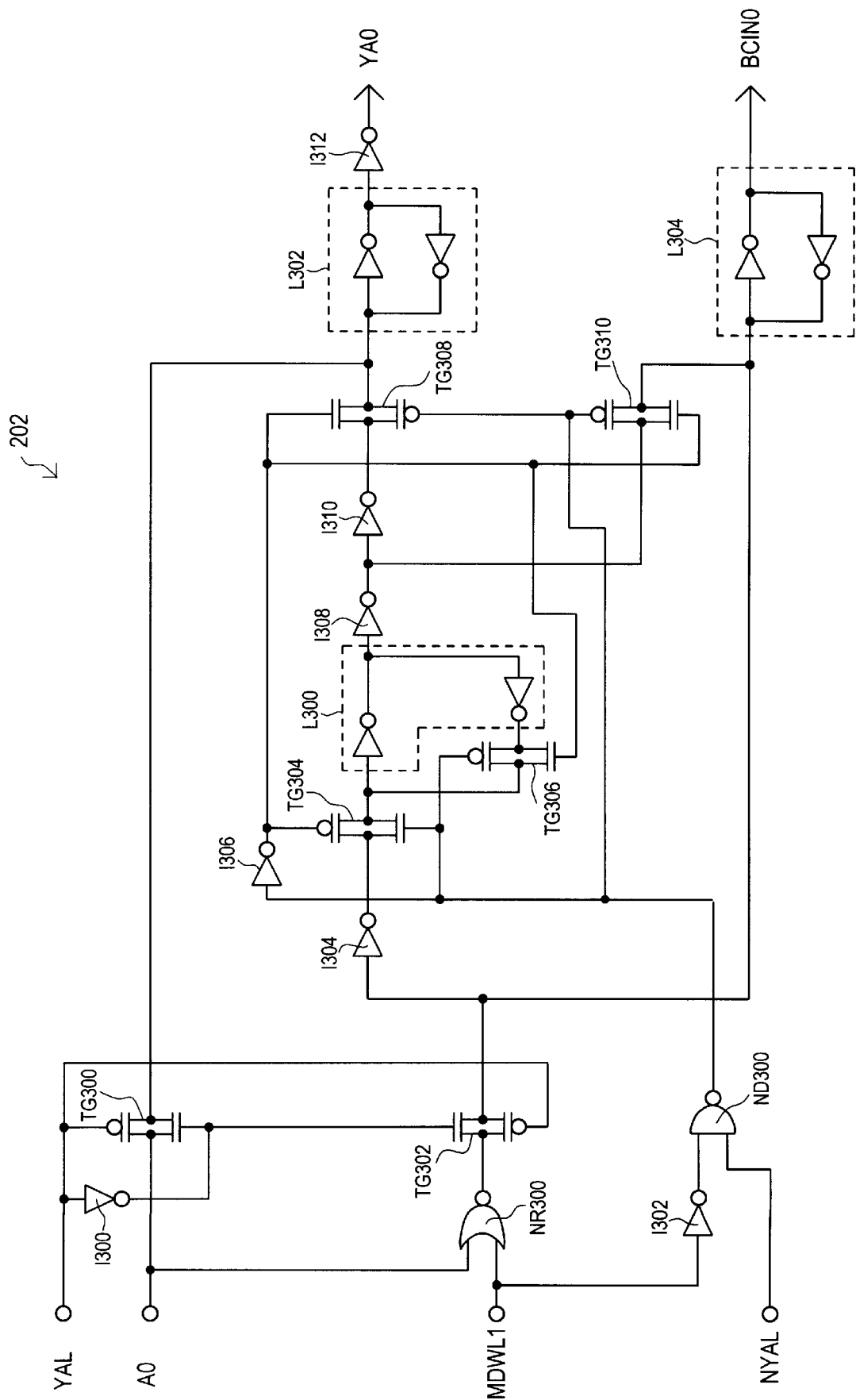
FIG. 3 is a schematic diagram of a first counter circuit that may be used in the address counter circuit of FIG. 2.
Figure 4:
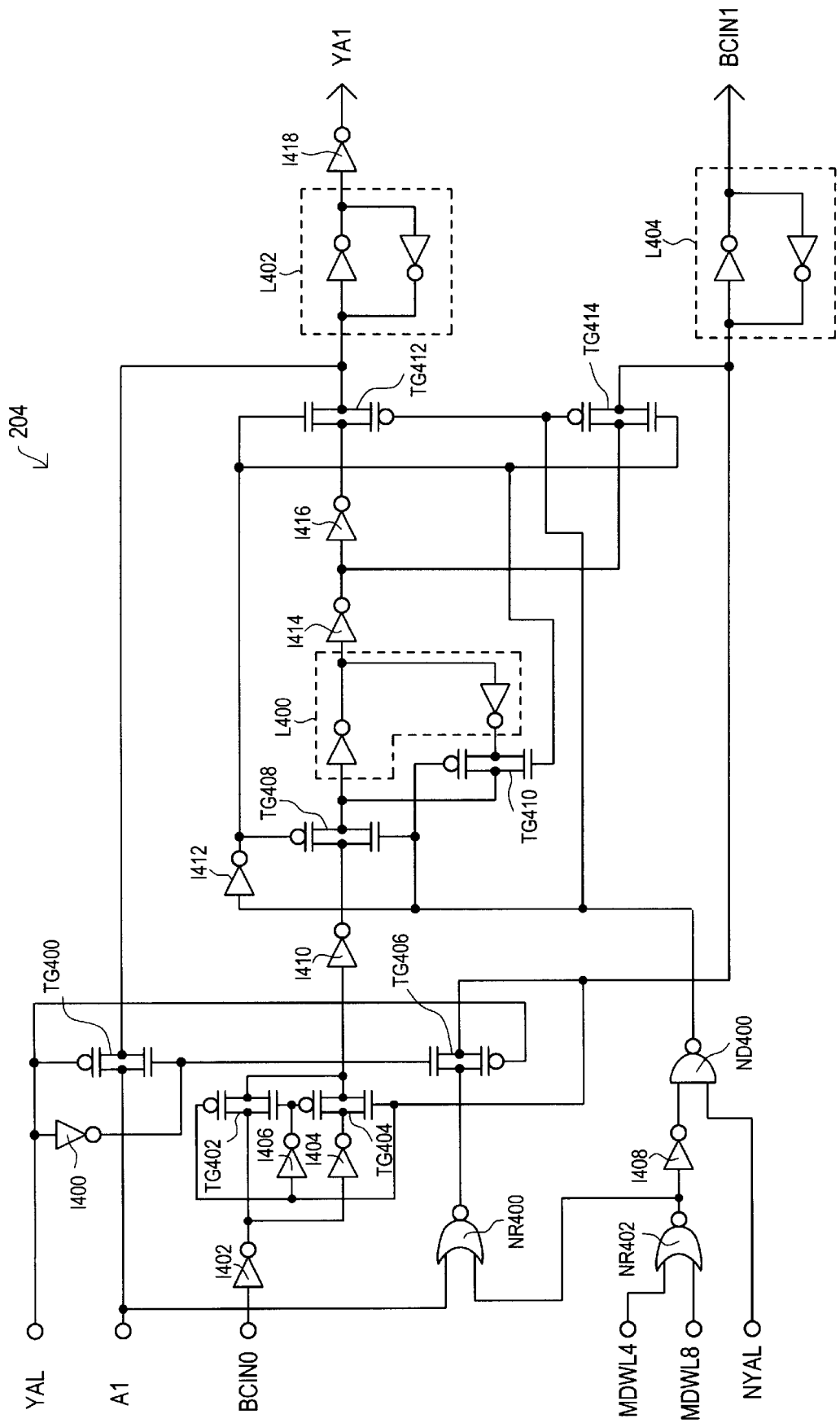
FIG. 4 is a schematic diagram of a second counter circuit that may be used in the address counter circuit of FIG. 2.
Figure 5:
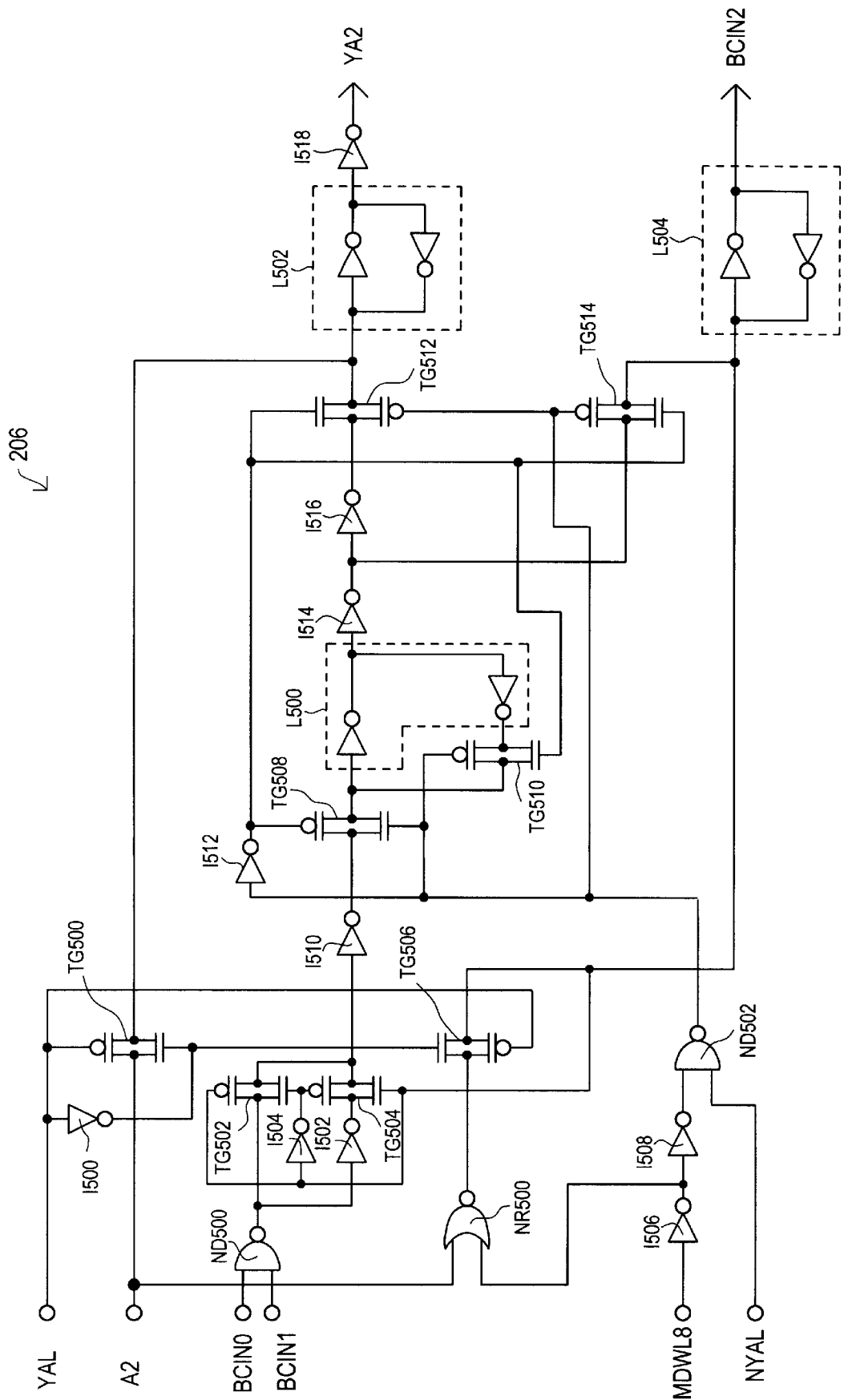
FIG. 5 is a schematic diagram of a third counter circuit that may be used in the address counter circuit of FIG. 2.
Figure 6:
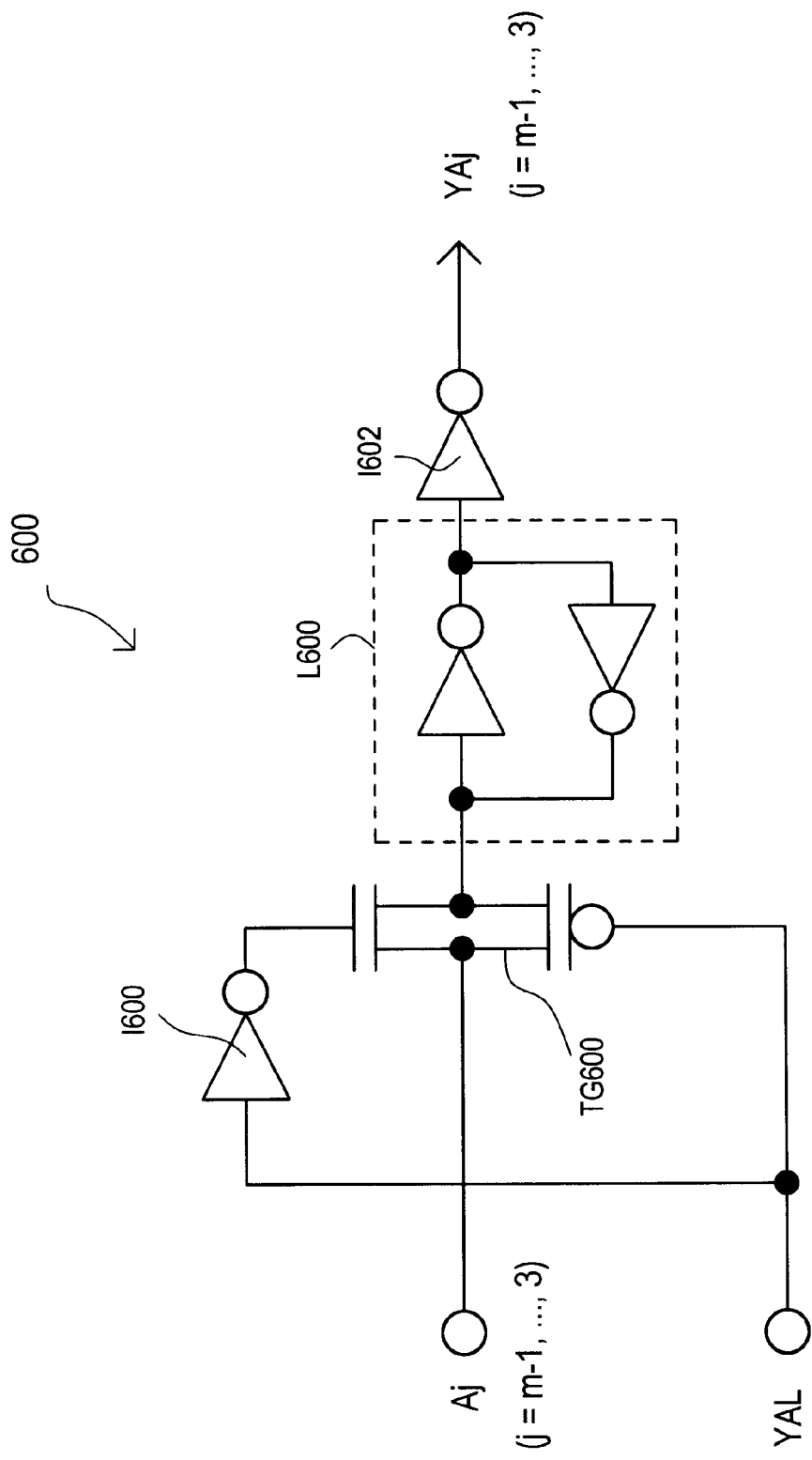
FIG. 6 is a schematic diagram of an address latch that may be used in the memory address generator in the first embodiment of FIG. 1.
Figure 7:
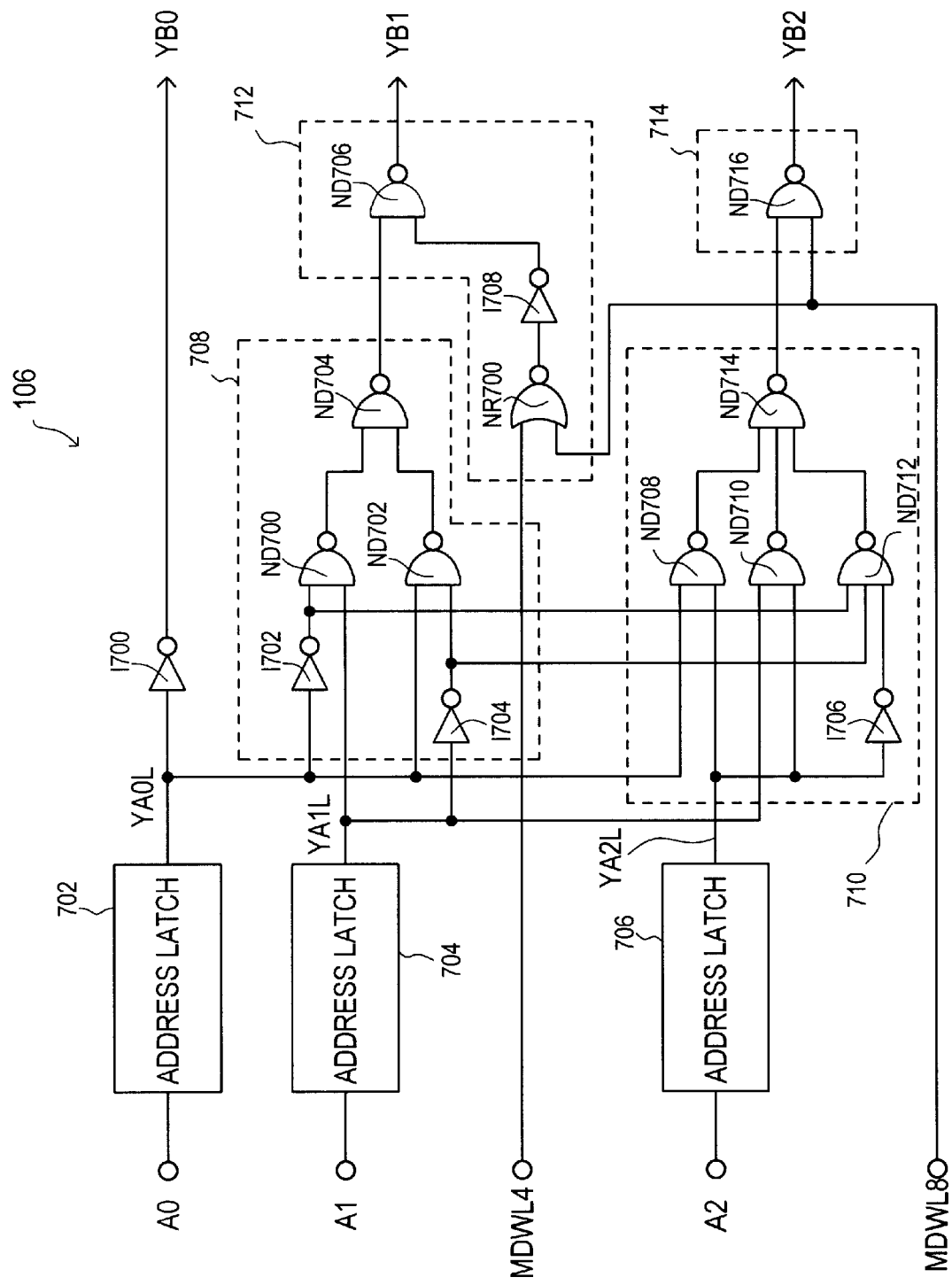
FIG. 7 is a schematic diagram of an end address arithmetic circuit that may be used in the first embodiment of FIG. 1.
Figure 8:
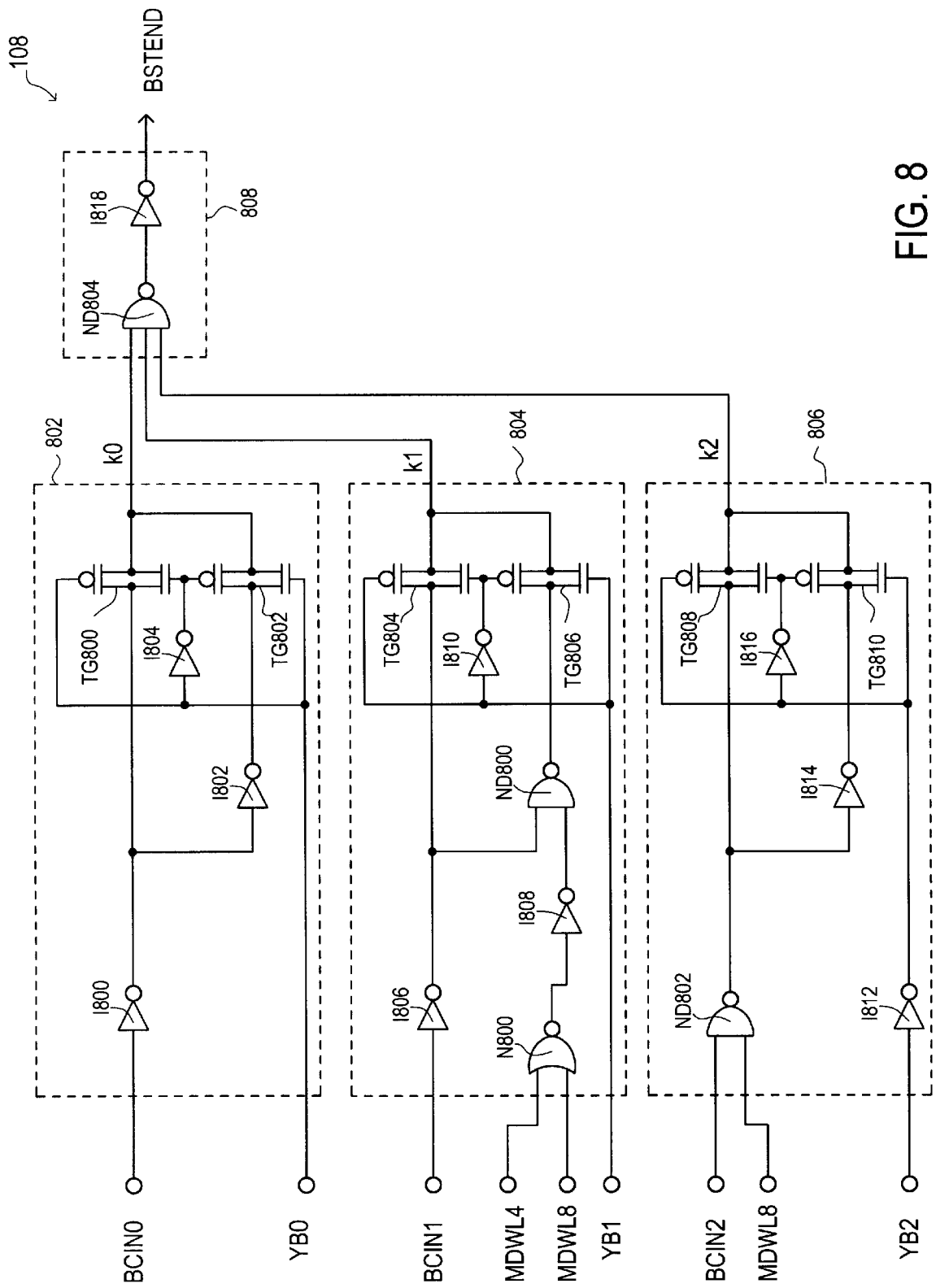
FIG. 8 is a schematic diagram of a comparator circuit that may be used in the first embodiment of FIG. 1.
Figure 9:
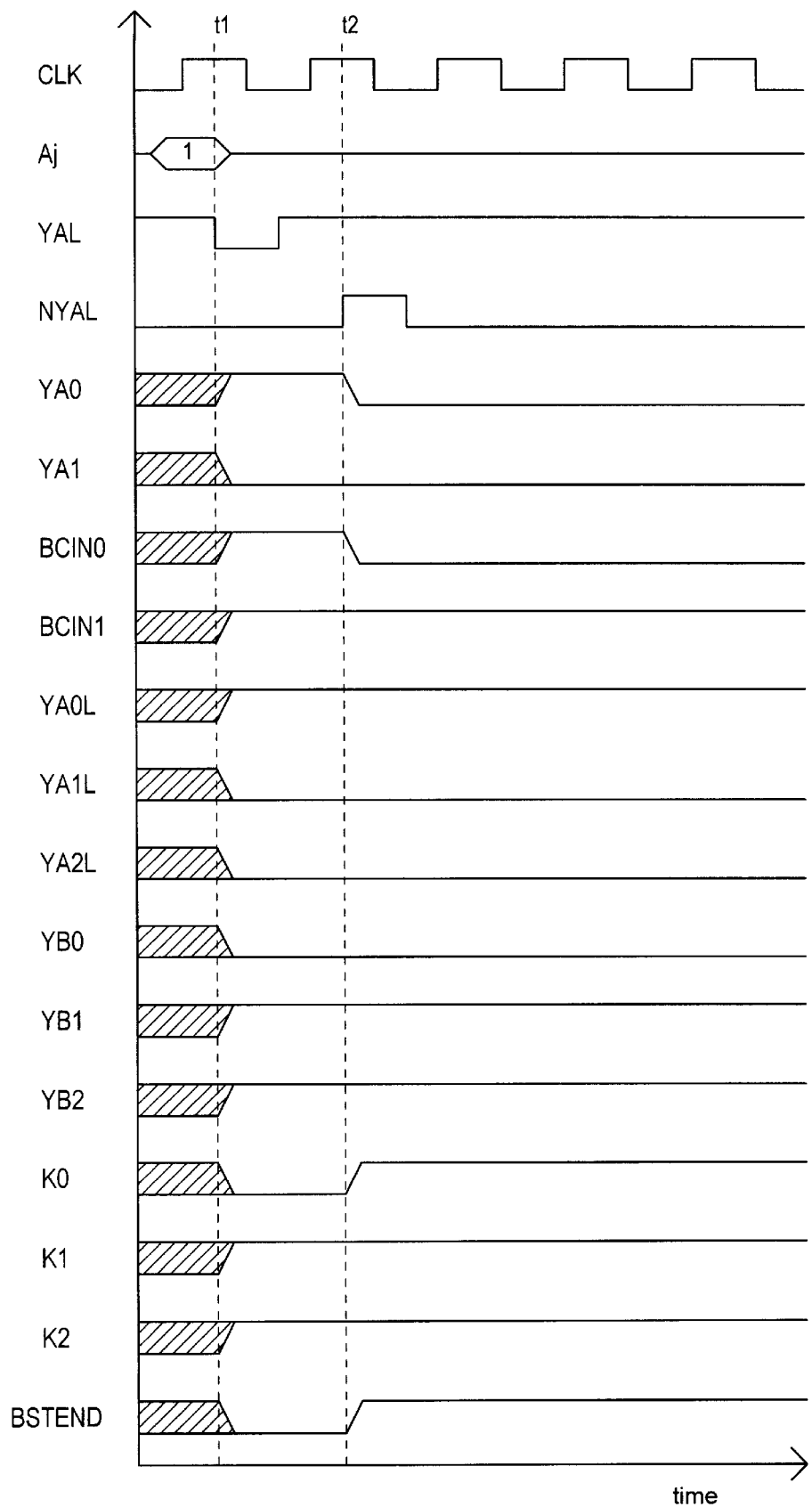
FIG. 9 is a timing diagram illustrating the operation of the first embodiment when the burst length is two.
Figure 10:
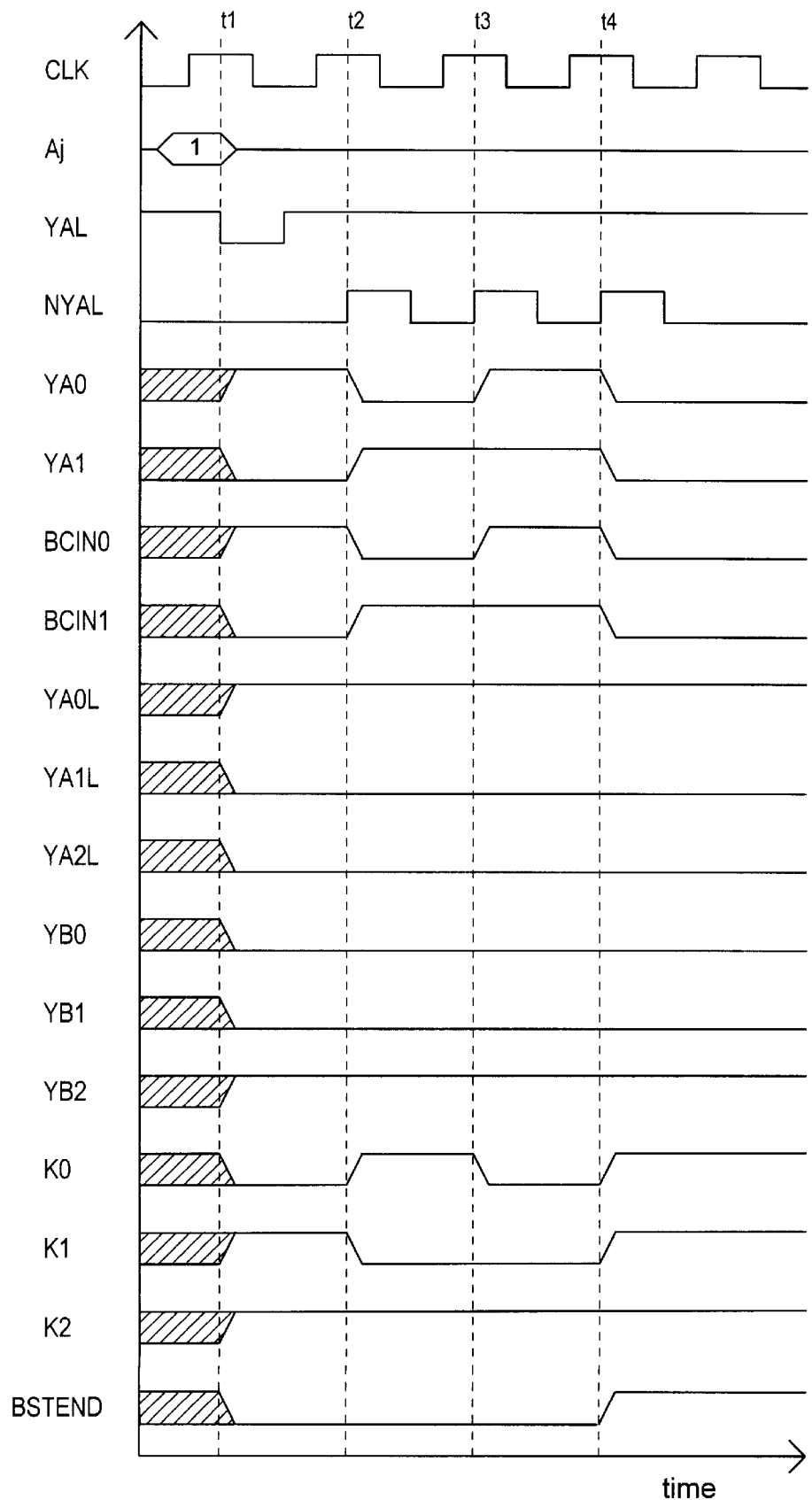
FIG. 10 is a timing diagram illustrating the operation of the first embodiment when the burst length is four.

Referring to FIGS. 1 to 10, a first embodiment will be described. FIG. 1 is a block diagram of a memory address generator according to the first embodiment of the present invention. FIG. 2 is a block diagram of an address counter circuit that may be used in the first embodiment of FIG. 1. FIG. 3 is a schematic diagram of a first counter circuit that may be used in the address counter circuit of FIG. 2. FIG. 4 is a schematic diagram of a second counter circuit that may be used in the address counter circuit of FIG. 2. FIG. 5 is a schematic diagram of a third counter circuit that may be used in the address counter circuit of FIG. 2. FIG. 6 is a schematic diagram of an address latch that may be used in the memory address generator in the first embodiment of FIG. 1. FIG. 7 is a schematic diagram of an end address arithmetic circuit that may be used in the first embodiment of FIG. 1. FIG. 8 is a schematic diagram of a comparator circuit that may be used in the first embodiment of FIG. 1. FIG. 9 is a timing diagram illustrating the operation of the first embodiment when the burst length is two. FIG. 10 is a timing diagram illustrating the operation of the first embodiment when the burst length is four.

Referring now to FIG. 1, the first embodiment of a memory address generator circuit is set forth and designated by the general reference character 100. The memory address generator circuit 100 is roughly made up of an address counter 102, an address latch 104, an end address arithmetic circuit 106, a comparator circuit 108, and a burst length setting circuit 110.

An address input $A_j (j=m-1, \ldots, 0)$ consisting of m bits is received externally as a start address. The address counter 102 latches the 3 least significant bits of the address input Aj. The address counter 102 increments and outputs the 3 least significant bits of a column address signal YA2-YA0 and also outputs carry signals BCIN2-BCIN0. The address latch 104 latches the higher m−3 significant bits of the start address $(A_{m-1}, \ldots, A_3)$ and holds them as the higher m−3 significant bits of the column address signal. The end address arithmetic circuit 106 also receives the 3 least significant bits of the address input $A_j$ and subtracts one from the three bits to provide an end address value YB2-YB0. The comparator circuit 108 compares the output carry signals BCIN2-BCIN0 of the address counter 102 with the end address YB2-YB0 of the end address arithmetic circuit 106 and outputs a burst end signal BSTEND when they are the same value. In response to a command input, the burst length setting circuit 110 generates signals MDWL1, MDWL4, and MDWL8 which designate the burst length.

Alternatively, the 3 least significant bits of the start address received by the address counter 102 may be thought of as seed bits to be used as a start point from which the address counter 102 will start the count in order to produce a count value. The same 3 least significant of the start address may conceptually be thought of as a count end count bits when received by the end address arithmetic circuit 106, which subtracts one from the end count word formed by the end count bits, thus producing the end count value. The memory address generator circuit 100 may be conceptualized as a bit sequence generator that generates bit sequences based on the start address received and the command input received.

The address counter 102 is further illustrated with reference to FIG. 2. FIG. 2 sets forth the address counter 102 from FIG. 1 in a block diagram. The address counter 102 of FIG. 2 is made up of a first counter circuit 202, a second counter circuit 204, and a third counter circuit 206. Each of the counter circuits is made up of the combination of an inverter, NOR gate, NAND gate, and a transfer gate consisting of a p-channel transistor and an n-channel transistor, and a latch formed by connecting two inverters each having its input node coupled to the others output node.

Referring to FIG. 3, the first counter circuit 202 is set forth in a schematic diagram. The first counter circuit 202 is made up of a NOR gate NR300, a NAND gate ND300, inverters 1300 to 1312, transfer gates TG300 to TG310 and latches L300 to L304. The first counter circuit 202 latches the least significant bit of the address input (A0) applied externally in synchronism with the falling edge of a column address latch signal YAL. The first counter circuit 202 increments the latched value on the rising edge of a succeeding column address latch signal NYAL The first counter circuit 202 outputs the least significant column address signal YA0 and carry signal BCIN0.

Referring to FIG. 4, the second counter circuit 204 is set forth in a schematic diagram. The second counter circuit 204 is made up of NOR gates NR400 and NR402, a NAND gate ND400, inverters 1400 to 1418, transfer gates TG400 to TG414 and latches L400 to L404. The second counter circuit 204 latches the second least significant bit of the address input (A1) applied externally in synchronism with the falling edge of the column address latch signal YAL. The second counter circuit 204 increments the latched value based on the carry signal BCIN0 from the first counter circuit 202 on the rising edge of the succeeding column address latch signal NYAL. The second counter circuit 204 outputs the second least significant column address signal YAl and carry signal BCIN1.

Referring to FIG. 5, the third counter circuit 206 is set forth in a schematic diagram. The third counter circuit 206 is made up of a NOR gate NR500, NAND gates ND500 and ND502, inverters 1500 to 1518, transfer gates TG500 to TG514 and latches L500 to L504. The third counter circuit 206 latches the third least significant bit of the address input (A2) applied externally in synchronism with the falling edge of the column address latch signal YAL. The third counter circuit 206 increments the latched value based on the carry signals BCIN0 and BCIN1 from the first and second counter circuits 202 and 204 on the rising edge of the succeeding column address latch signal NYAL. The third counter circuit 206 outputs the third least significant column address signal YA2 and carry signal BCIN2.

In the preferred embodiment, the signals MDWL1, MDWL4, and MDWL8 are generated by the burst length setting circuit 110 as can be seen in FIG. 1. In the case of a burst length=1, the signal MDWL1 becomes a logic high level. In the case of a burst length=4, the signal MDWL4 becomes high. In the case of a burst length=8, the signal MDWL8 becomes a logic high level. In the case of burst length=2, the signals MDWL1, MDWL4, and MDWL8 are all at a logic low level.

Thus, when the burst length=1 (MDWL1 is high), the first counter circuit 202 outputs the least significant bit (A0) of the externally applied address as the least significant bit (YA0) of the column address signal without incrementing it. However, when the burst length=2 (MDWL1–MDWL8 are all low), the first counter circuit 202 increments the least significant bit (A0) of the externally applied address and outputs it as the least significant bit (YA0) of the column address signal.

When the burst length=4 (MDWL4 is high), the first counter circuit 202 and the second counter circuit 204 increment the two least significant bits (Al and AO) of the externally applied address and output them as the two least significant bits (YA1 and YA0) of the column address signal.

Likewise, when the burst length=8 (MDWL8 is high), the first counter circuit 202, the second counter circuit 204, and the third counter circuit 206 increment the three least significant bits (A2 - A0) of the externally applied address and output them as the three least significant bits (YA2 - YA0) of the column address signal.

Referring to FIG. 6, a stage of the address latch 104 from the preferred embodiment of FIG. 1 is set forth and designated by the general reference character 600. Each address bit applied externally to the address latch 104 requires one address latch stage 600. Each address latch stage 600 includes inverters I600 and 1602, a transfer gate TG600, and a latch L600. It is noted that the address latch stage 600 is constructed so as to be equivalent to the address latching mechanism in the first, second, and third counter circuits 202, 204, and 206 respectively, which allows it to also be installed into those circuits. The address signal $A_j$ is applied externally to the latch L600 through the transfer gate TG600 when the column address latch signal YAL is at a logic low level. When the address latch signal returns to a logic high level, the state of the externally applied address $A_j$ is latched in the latch L600. The address latch stage 600 produces the column address signal $YA_j$ (j=m−1 to 3), which is output to a column address decoder (not shown).

Referring to FIG. 7, the end address arithmetic unit 106 of the preferred embodiment of FIG. 1 is set forth in a schematic diagram. The end address arithmetic unit 106 is comprised of address latches 702–706, a first subtractor circuit 708, a second subtractor circuit 710, a first subtractor enable circuit 712, a second subtractor enable circuit 714 and an inverter 1700. The first subtractor circuit 708 includes inverters I702 and I704 and NAND gates ND700 to ND704. The second subtractor circuit 710 includes inverter 1706 and NAND gates ND708 to ND716. The first subtractor enable circuit 712 includes NOR gate NR700, inverter 1708 and NAND gate ND706. The second address enable circuit 714 includes NAND gate ND716. The address latches 702–706 have the same structure as the address latch stage 600 of FIG. 6.

The address latch 702 receives the least significant bit (A0) of the externally applied address and produces a latched address signal YA0L which is inverted by inverter I700 to output the least significant bit (YB0) of the end address. The address latch 704 receives the externally applied address bit A1 and produces a latched address signal YA1L. The address latch 706 receives the externally applied address bit A2 and produces a latched address signal YA2L. The first subtractor circuit 708 receives the latched address signal YA1L and will subtract one from it based on the value of the latched address YA0L. The first subtractor circuit output (output of NAND gate ND704) is applied to the second least significant bit (YB1) of the end address by way of the first subtractor enable circuit 712. The first subtractor enable circuit 712 will pass the first subtractor circuit output to generate YB1 if either burst length indicator signals MDWL4 (burst length=4) or MDWL8 (burst length=8) are high. The second subtractor circuit 710 receives the latched address signal YA2L and will subtract one from it based on the value of the latched addresses YA0L and YA1L. The second subtractor circuit output (output of NAND gate ND714) is applied to the third least significant bit (YB2) of the end address by way of the second subtractor enable circuit 714. The second subtractor enable circuit 714 will pass the second subtractor circuit output to generate YB2 if the burst length indicator signal MDWL8 (burst length=8) is high.

Referring to FIG. 8, the comparator circuit 108 of the preferred embodiment of FIG. 1 is set forth in a schematic diagram. The comparator circuit 108 includes a first coincidence detector circuit 802, a second coincidence detector circuit 804, a third coincidence detector circuit 806, and a compare output circuit 808. The first coincidence detector circuit 802 includes inverters I800 to I804, and CMOS transfer gates TG800 and TG802. The first coincidence detector circuit 802 compares the carry signal BCIN0 and the least significant end address YB0 and outputs a first coincidence signal k0. The first coincidence signal k0 is high when the compared signals "match" and low when there is a "mismatch." The second coincidence detector circuit 804 includes inverters I806 to I810, NOR gate NR800, NAND gate ND800, and CMOS transfer gates TG804 and TG806. The second coincidence detector circuit 804 is enabled when either burst length indicator signal MDWL4 or MDWL8 is high. When MDWL4 or MDWL8 is high, the second coincidence detector circuit 804 compares the carry signal BCIN1 and the second least significant end address YB1 and outputs a second coincidence signal k1. The second coincidence signal k1 is high when the compared signals "match" and low when there is a "mismatch." When both MDWL4 and MDWL8 are low, the second coincidence circuit 804 is disabled and the second coincidence signal k1 is a logic high. The third coincidence detector circuit 806 includes inverters I812 to I816, NAND gate ND802, and CMOS transfer gates TG808 and TG810. The third coincidence detector circuit 806 is enabled when the burst length indicator signal MDWL8 is high. When MDWL8 is high, the third coincidence detector circuit 806 compares the carry signal BCIN2 and the third least significant end address YB2 and outputs a third coincidence signal k2. The third coincidence signal k2 is high when the compared signals "match" and low when there is a "mismatch." When MDWL8 is low, the third coincidence circuit is disabled and the third coincidence signal k2 is a logic high. The compare output circuit 808 includes a NAND gate N804 and inverter I818. The compare output circuit 808 receives the first, second and third coincidence signals (k0–k2) and outputs the burst end signal BSTEND. BSTEND is a logic high when all of the coincidence signals (k0–k2) are a logic high. The BSTEND is a logic low if any of the coincidence signals (k0–k2) is a logic low.

A description will now be given of the memory address generator circuit 100 during a burst operation with the burst length being two (MDWL1=0, MDWL4=0, and MDWL8= 0) with reference to FIG. 9 in conjunction with FIGS. 1 to 8. FIG. 9 sets forth a timing diagram of various signals in the memory address generator circuit 100 during a burst operation having a burst length of two. Because MDWL4=0 and MDWL8=0, the second and third coincidence signals (k1 and k2) of FIG. 8 are both logic high regardless of the values of the externally applied addresses A1 and A2. Thus, the burst end signal BSTEND is determined only by the value of the first coincidence signal k0 as determined by the values of carry signal BCIN0 and end address YB0.

In the example of FIG. 9, the start address is 1 (decimal) which is externally applied along with a read or write command. At time t1, the column address latch signal YAL is generated from a control circuit and received by the first counter circuit 202. The transfer gate TG300 turns on and the address A0=1 is latched by the latch L302 which causes the column address signal YA0=1 to be outputted. At this time, the carry signal BCIN0=1 is latched into the latch L304 in the first counter circuit 202 of FIG. 3. Also at this time, in the second counter circuit 204 of FIG. 4 YA1=0 is latched into the latch L402 and BCIN1=1 is latched into the latch L404. In the particular case with the burst length of two both carry signals BCIN1 and BCIN2 are irrelevant because MDWL4 and MDWL8 are both logic low. Also at this time, the start address of 1 causes the end address arithmetic unit 106 of FIG. 7 to generate latched address signals of YA0L= 1, YA1L=0, and YA2L=0, which causes YB0=0, and the low MDWL4 and MDWL8 signals cause YB1=1 and YB2=1 to be outputted as the value of the end address signals. In the comparator circuit 108 of FIG. 8, BCIN0=1 and YB0=0 causes the first coincidence circuit 802 to output a first coincidence signal k0 to be a logic low or zero. Because both MDWL4 and MDWL8 are logic low, both the second coincidence signal k1 and the third coincidence signal k2 are logic high or one. Because k0=0, k1=1, and k2=1, the compare output circuit 808 in the compare circuit 108 outputs a burst end BSTEND=0 signaling that the burst operation is not complete.

In a succeeding clock (CLK) at time t2, the succeeding column address latch signal NYAL is generated and the first counter circuit 202 increments the column address signal YA0 so that it becomes a logic low or zero. The column signal YA1 remains unchanged as a zero because MDWL4 and MDWL8 are logic low.

The carry signal BCIN0 transitions from a one to a zero, however, the carry signal BCIN1 remains unchanged. The end address signals do not change. The first coincidence signal k0 from the first coincidence circuit 802 in the comparator circuit 108 of FIG. 8 will transition from a zero to a one. As the second and third coincidence signals (k1 and k2) remain unchanged, the values of k0=1, k1=1, and k2=1 causes the compare output circuit 808 to produce a burst end signal BSTEND=1, and the burst operation is completed.

A description will now be given of the memory address generator circuit 100 during a burst operation with the burst length being four (MDWL1=0, MDWL4=1, and MDWL8= 0) with reference to FIG. 10 in conjunction with FIGS. 1 to 8. FIG. 10 sets forth a timing diagram of various signals in the memory address generator circuit 100 during a burst operation having a burst length of four. Because MDWL8= 0, the third coincidence signal k2 of FIG. 8 is a logic high regardless of the values of the externally applied address A2. Thus, the burst end signal BSTEND is determined only by the value of the first and second coincidence signals k0 and k1 as determined by the values of carry signals BCIN0 and BCIN1 and end addresses YB0 and YB1.

In the example of FIG. 10, the start address is 1 (decimal), which is externally applied along with a read or write command. At time t1, the column address latch signal YAL is generated from a control circuit and received by the first counter circuit 202. The transfer gate TG300 turns on and the address A0=1 is latched by the latch L302 which causes the column address signal YA0=1 to be outputted. Also at time t1, the carry signal BCIN0=1 is latched into the latch L304 in the first counter circuit 202 of FIG. 3. Also at this time because the external address A1=0, in the second counter circuit 204 of FIG. 4 YA1=0 is latched into the latch L402 and BCIN1=0 is latched into the latch L404. In the particular case with the burst length of four, carry signal BCIN2 is irrelevant because MDWL8 is a logic low. Also at this time, the start address of 1 causes the end address arithmetic unit 106 of FIG. 7 to generate latched address signals of YA0L=1, YA1L=0, and YA2L=0, which causes YB0=0 and YB1=0, and the low MDWL8 signal causes YB2=1 to be outputted as the value of the end address signals. In the comparator circuit 108 of FIG. 8, BCIN0=1 and YB0=0 causes the first coincidence circuit 802 to output a first coincidence signal k0 to be a logic low or zero. Also, BCIN1=0 and YB1=0 causes the second coincidence circuit 804 to output a second coincidence signal k1 to be a logic high. Because MDWL8 is a logic low, the third coincidence signal k2 is a logic high or one. Because k0=0, k1=1, and k2=1, the compare output circuit 808 in the compare circuit 108 outputs a burst end BSTEND=0 signaling that the burst operation is not complete.

In a succeeding clock (CLK), at time t2 the succeeding column address latch signal NYAL is generated and the first counter circuit 202 increments the column address signal YA0 so that it becomes a logic low or zero. Also upon receiving NYAL, the second counter circuit 204 increments the column address signal YA1 so that it becomes a logic high or one.

Also at time t2, the carry signal BCIN0 from the first counter circuit 202 transitions from a high to a low and the carry signal BCIN1 from the second counter circuit 204 transitions from a low to a high. The states of the latched addresses remain the same (YA0L=1, YA1L=0, and YA2L=0), thus the end address signals remain unchanged (YB0=0, YB1=0, and YB2=1). In the comparator circuit 108, the coincidence detectors 802 to 806 compare the carry signals BCIN0–BCIN2 with the end address signals YB0–YB2 and obtain coincidence signals k0=1, k1=0, and k2=1 (k2 always remains high because MDWL8=0). Thus, the burst end signal remains a logic zero (BSTEND=0) and the burst operation is not completed.

In a succeeding clock (CLK), at time t3 the succeeding column address latch signal NYAL is generated and the first counter circuit 202 increments the column address signal YA0 so that it becomes a logic high or one. The column address signal YA1 from the second counter circuit 204 remains a logic high or one.

Also at time t3, the carry signal BCIN0 from the counter circuit 202 transitions from a low to a high and the carry signal BCIN1 from the counter circuit 204 remains high. The states of the latched addresses remain the same (YA0L=1, YA1L=0, and YA2L=0), thus the end address signals remain unchanged (YB0=0, YB1=0, and YB2=1). In the comparator circuit 108, the coincidence detectors 802 to 806 compare the carry signals BCIN0–BCIN2 with the end address signals YB0–YB2 and obtain coincidence signals k0=0, k1=0, and k2=1 (k2 always remains high because MDWL8=0). Thus, the burst end signal remains a logic zero (BSTEND=0) and the burst operation is not completed.

In a succeeding clock (CLK), at time t4 the succeeding column address latch signal NYAL is generated and the first counter circuit 202 increments the column address signal YA0 so that it becomes a logic low or zero. The column address signal YA1 from the second counter circuit 204 is incremented and becomes logic low or zero.

Also at time t4, the carry signal BCIN0 from the counter circuit 202 transitions from a high to a low and the carry signal BCIN1 from the counter circuit 204 transitions from a high to a low. The states of the latched addresses remain the same (YA0L=1, YA1L=0, and YA2L=0), thus the end address signals remain unchanged (YB0=0, YB1=0, and YB2=1). In the comparator circuit 108, the coincidence detectors 802 to 806 compare the carry signals BCIN0–BCIN2 with the end address signals YB0–YB2 and obtain coincidence signals k0=1, k1=1, and k2=1 (k2 always remains high because MDWL8=0). This causes the compare output circuit 808 to produce a burst end signal BSTEND=1, and the burst operation is completed.

As described above, in the memory address generator circuit 100, reading and writing can be made with the designated the burst length without the addition of the start address to the address counter that increments up from zero, which is not required for generating the column address. Thus, the circuit structure is simplified and the arithmetic speed can be improved.

Figure 11:
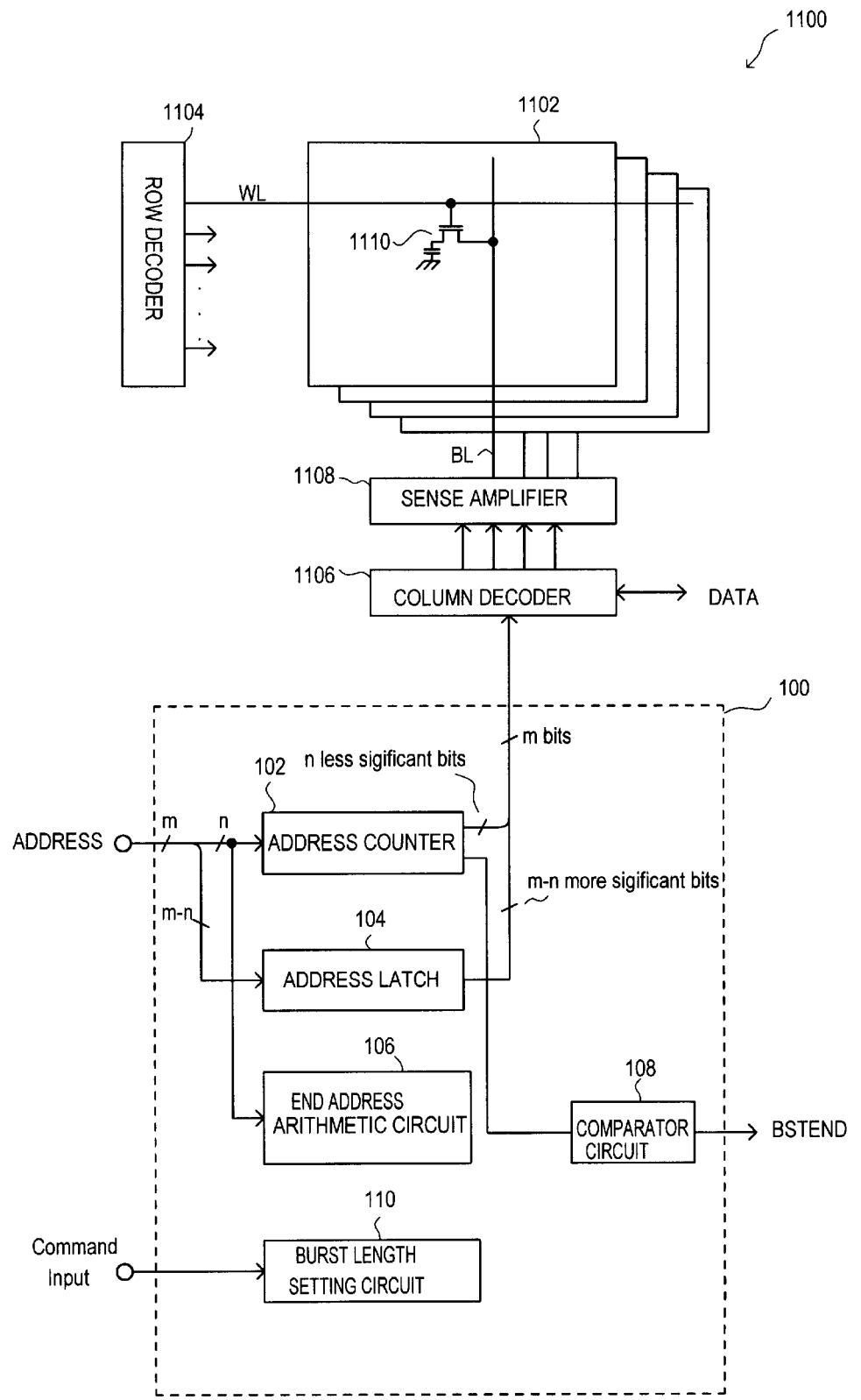
FIG. 11 is a block diagram of a semiconductor memory device in accordance with a second embodiment of the invention.
Figure 12:
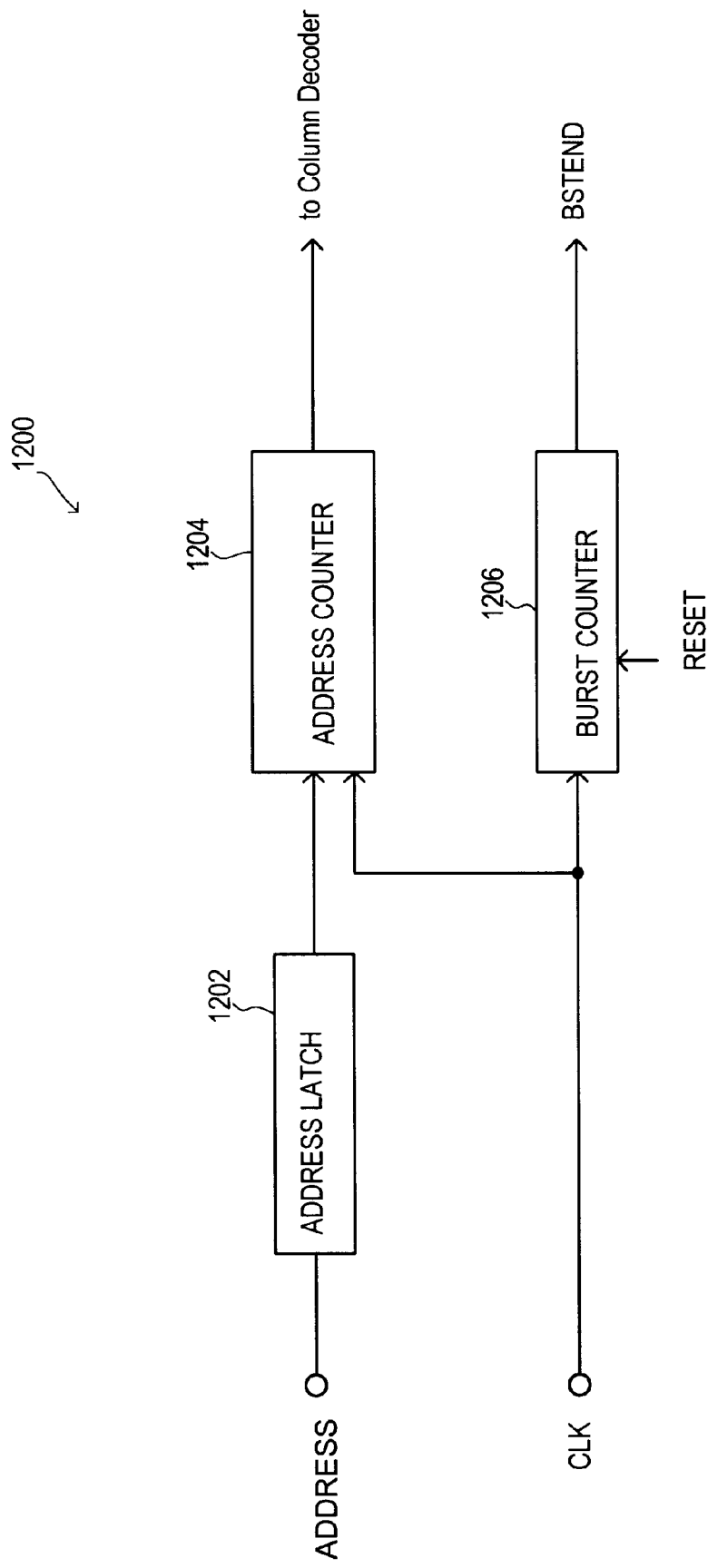
FIG. 12 is a block diagram of a conventional memory address generator circuit.
Figure 13:
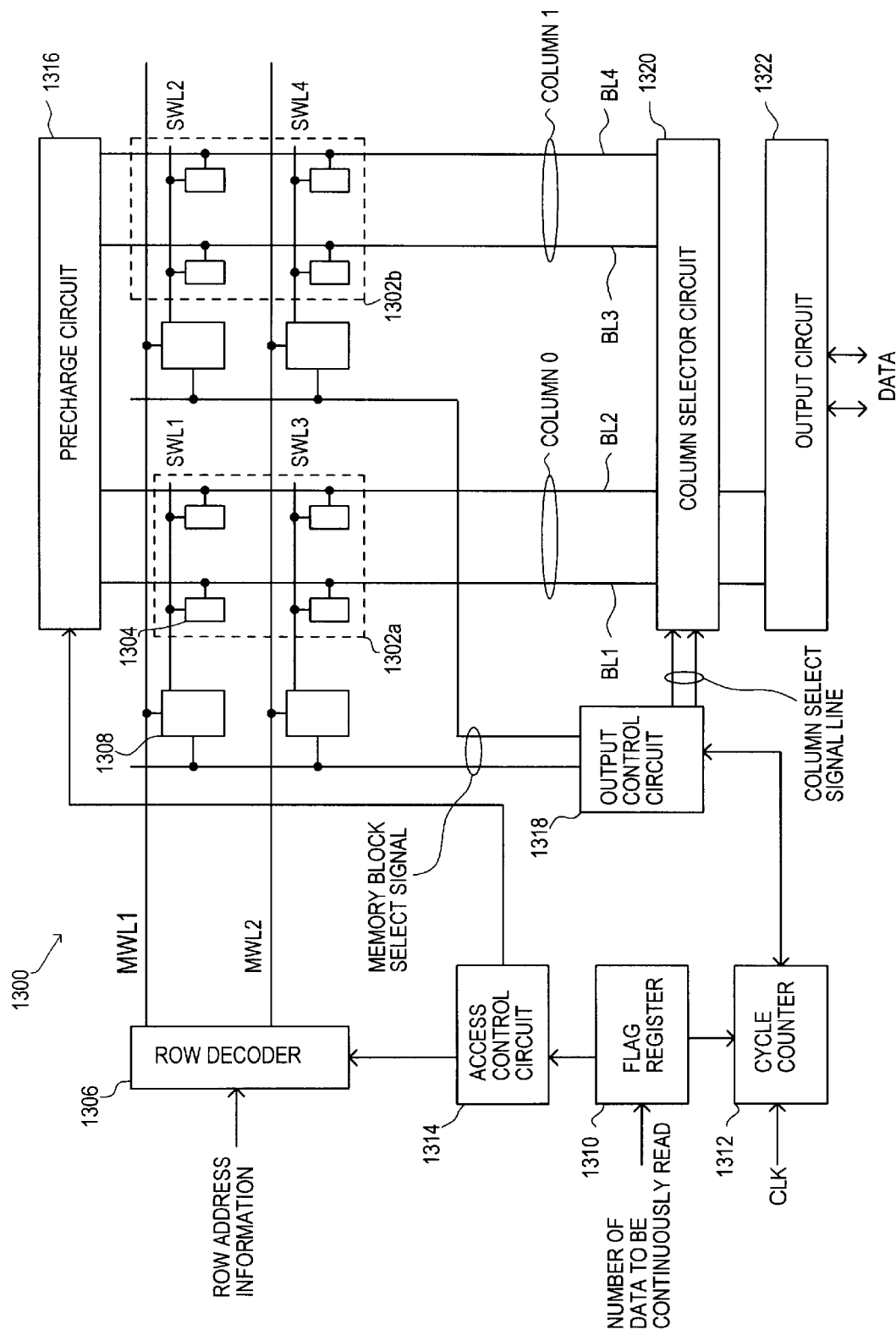
FIG. 13 is a block diagram of a conventional semiconductor memory device.

Referring to FIG. 11, a second embodiment of the invention is set forth as a semiconductor memory device and designated with the general reference character 1100. FIG. 11 illustrates how the memory address generator 100 of the first embodiment is applied to the semiconductor memory device 1100.

The semiconductor memory device 1100 includes a memory array 1102, a row decoder 1104, a column decoder 1106, a sense amplifier 1108, and a memory address generator circuit 100.

In the memory array 1102 word lines WL are disposed in a row direction and bit lines BL are disposed in a column direction. The memory array 1102 includes a matrix of memory elements 1110 that are located at the cross points of word lines WL and bit lines BL. The row word line WL in the memory array 1102 is selected by the row decoder 1104 according to the row address received. The memory address generator 100 has the same structure and function as described in the first embodiment and generates the column address to be used to select a bit line BL in the memory array 1102. The sense amplifier 1108 may write data to a memory element 1110 determined by the selected word line WL and bit line BL or amplifies and outputs data read from the memory element 1110.

The operation of the semiconductor memory device 1100 will now be described with reference to FIG. 11.

In the memory array 1102 the row decoder 1104 selects a word line WL according to the row address. Likewise, the column decoder 1106 selects a bit line BL according to a column address. Thus, data sensed by the sense amplifier 1108 is read from or written to the selected memory element 1110.

With a start address of m bits, the memory address generator circuit 100 latches the n least significant start address bits in the address counter 102 so they can be incremented. The more significant m-n start address bits are latched in the address latch 104. Thus, the read and write address is generated in the memory address generator circuit 100 the m−n more significant address bits in the address latch 104 and the lower significant n address bits comprising the count value in the address counter 102.

The end address arithmetic circuit 106 receives the n less significant address bits and produces a burst end address by subtracting one from the n less significant address bits. The count value of the address counter 102 and the calculated burst end address value of the end address arithmetic circuit 106 are compared with each other in the comparator circuit 108. When the calculated burst end address coincides with the count value of the counter circuit 102, the comparator circuit 108 produces the burst end signal BSTEND, which signals that the read/write burst operation to the memory array 1102 has been completed.

As described above, in the semiconductor memory device 1100, a read/write operation can be made according to the designated burst length. Because the addition of the start address to the incremented address counter value is not required for generating the column address, the circuit structure is simplified, the arithmetic speed can be improved, and the power consumption can be reduced. These factors make it possible to speed up the overall operation of the semiconductor memory device without increasing chip size or power consumption.

It should be noted that the present invention could be subject to various changes without departing from the spirit and scope of the invention. For example, the address counter and the address latch may be provided separately. Also, the address counter, the address latch, the end address arithmetic circuit and the comparator circuit are not limited to the structures shown in the figures, but the required function and operation may be realized by using various logic elements.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claimns.

What is claimed is:

1. An address generator circuit, comprising:
    a plurality of terminals for receiving a start address having m bits;
    a counter which latches the n least significant bits of the start address, the counter incrementing the n least significant bits in response to a clock signal to produce a count value;
    an address latch for latching m-n more significant bits of the start address;
    an end address arithmetic circuit for producing a burst end address by subtracting one from the n least significant bits of the start address;
    a comparator circuit for generating a burst end signal having a predetermined level when the count value matches the burst end address; and
    wherein a read and/or write operation is completed by stopping the incrementing in the counter when the burst end signal is generated.

2. The memory address generator circuit of claim 1, wherein:
    the counter includes a first counter circuit that latches the least significant bit of the start address bits in response to an address latch signal, and increments the least significant bit when a first burst length designation signal is at a predetermined level and produces a least significant bit of the count value.

3. The memory address generator circuit of claim 2, wherein:
    the counter further includes a second counter circuit that latches the second least significant bit of the start address bits in response to the address latch signal, and increments the second least significant bit when a second burst length designation signal is at a predetermined level and produces a second least significant bit of the count value.

4. The memory address generator circuit of claim 3, wherein:
    the counter further includes a third counter circuit that latches the third least significant bit of the start address bits in response to the address latch signal, and increments the third least significant bit when a third burst length designation signal is at a predetermined level and produces a third least significant bit of the count value.

5. The memory address generator circuit of claim 1, wherein:
    the address latch includes at least m−n latch circuits for latching the values of the m−n more significant bits of the start address in response to an address latch signal.

6. The memory address generator circuit of claim 1, wherein:
    the end address arithmetic circuit includes:
        a first subtractor circuit which inverts the least significant bit of the start address and outputs a least significant bit of the burst end address; and
        a second subtractor circuit which inverts the second least significant bit of the start address when the least significant bit of the start address is at a predetermined value.

7. The memory address generator circuit of claim 6, wherein:
    the end address arithmetic circuit further includes a third subtractor circuit which inverts the third least signifi-
cant bit of the start address when the first and second least significant bit of the start address are at predetermined levels and outputs a third least significant bit of the burst end address therefrom.

8. The memory address generator circuit of claim 1, wherein:
    the counter includes a first counter circuit producing a first carry signal; and
    the comparator circuit includes a first coincidence detector circuit for detecting a match between the least significant bit of the burst end address and the first carry signal and producing a first coincidence signal therefrom.

9. The memory address generator circuit of claim 8, wherein:
    the counter includes a second and third counter circuit producing a second and third carry signal respectively; and
    the comparator further includes:
        a second coincidence detector circuit for detecting a match between the second least significant bit of the burst end address and the second carry signal and producing a second coincidence signal therefrom; and
        a third coincidence detector circuit for detecting a match between the third least significant bit of the burst end address and the third carry signal and producing a third coincidence signal therefrom.

10. The memory address generator circuit of claim 9, wherein:
    the comparator further includes a compare output circuit that receives the first, second, and third coincidence signals and produces the burst end signal therefrom.

11. A semiconductor memory device comprising:
    an array of memory elements disposed in rows in columns;
    a plurality of word lines disposed in a row direction, each word line coupled to a row of memory elements;
    a plurality of bit lines disposed in a column direction, each bit line coupled to a column of memory elements;
    a row decoder for selecting a predetermined word line based on the value of a row address;
    a column decoder for selecting a predetermined bit line based on the value of a column address;
    a memory address generator circuit for generating the column address, the memory address generator including:
        a burst length designation circuit that receives a command input, the burst length designation circuit providing at least one burst length designation signal determined by the value of the command input;
        an address counter that receives n least significant bits of an m bit start address and produce a count value, the count value being incremented or decremented in response to a clock;
        a burst end address generator that receives the n least significant bits of the m bit start address and provide a burst end address; and
        a comparator that receives the burst end address and the count value, and compares the burst end address and the count value and produces a burst end signal having a disable level if the comparison produces a match and having an enable level if the comparison produces a mismatch;
    wherein the count value forms a portion of the column address.

12. The semiconductor memory device of claim 11, further including:

an address latch that receives the m-n more significant bits of the start address and provides m-n latched outputs therefrom, the latched outputs forming another portion of the column address.

13. The semiconductor storage device of claim 11, wherein:

the address counter is disabled when the burst end signal is at the disable level.

14. The semiconductor memory device of claim 11, wherein:

the address counter increments or decrements the count value in response to the clock when the burst end signal is at the enable level.

15. The semiconductor memory device of claim 1, wherein:

the burst end address generator receives at least one burst length designation signal and the burst end address is determined by the value of the at least one burst length designation signal.

16. The semiconductor memory device of claim 11, wherein:

the burst end address is determined by subtracting one from the value of at least one of the n least significant bits of the m bit start address.

17. A bit sequence generator comprising:

a counter coupled to receive a plurality of seed bits, the counter for incrementing or decrementing at least one of the seed bits to produce a count value;

an end count arithmetic circuit coupled to receive at least one end count bit forming an end count word, the end count arithmetic circuit producing an end count value by subtracting one from the end count word; and a comparator circuit coupled to receive the count value and the end count value, the comparator comparing the count value with the end count value and producing a compare output having a match logic level and a mismatch logic level.

18. The bit generator of claim 17, further including:

a count length designation circuit coupled to receive command bits, the count length designation circuit producing at least one count length signal; and the end count arithmetic circuit receives the at least one count length signal and the number of end count bits forming the end count word is determined by the at least one count length signal.

19. The bit generator of claim 17, further including:

a count length designation circuit coupled to receive command bits, the count length designation circuit producing at least one count length signal; and the counter receives the at least one count length signal and the number of seed bits incremented or decremented by the counter is determined by the at least one count length signal.

20. The bit generator of claim 17, wherein:

the plurality of seed bits and the end count word are the same.

* * * * *